United States Patent [19]
Ho et al.

[11] Patent Number: 5,899,760
[45] Date of Patent: May 4, 1999

[54] CONNECTOR ASSEMBLY

[75] Inventors: Yu-Ming Ho, Pen-Chiao; Min-Fang Wu, Tu-Chen; Hung-Chi Yu, Hsi-Chih Chen, all of Taiwan

[73] Assignee: Hon Hai Precision Ind. Co., Ltd., Taipei Hsien, Taiwan

[21] Appl. No.: 09/041,837

[22] Filed: Mar. 12, 1998

[30] Foreign Application Priority Data

Mar. 12, 1997 [TW] Taiwan ................................. 86203812

[51] Int. Cl.$^6$ .................................................. H01R 13/44

[52] U.S. Cl. .............................. 439/135; 439/940; 29/743

[58] Field of Search .................................... 439/135, 940; 29/741, 743, 739

[56] References Cited

U.S. PATENT DOCUMENTS

| | | | |
|---|---|---|---|
| 5,507,657 | 4/1996 | Seto et al. | 439/940 |
| 5,558,540 | 9/1996 | Kato et al. | 439/940 |
| 5,613,864 | 3/1997 | Northey | 439/940 |
| 5,681,174 | 10/1997 | Correll, Jr. et al. | 439/940 |
| 5,688,133 | 11/1997 | Ikesugi et al. | 439/135 |

*Primary Examiner*—Neil Abrams
*Assistant Examiner*—Jean F. Duverne

[57] ABSTRACT

A connector assembly includes at least two connectors arranged substantially adjacent to each other for allowing a cover to detachably engage the connectors. The cover is configured so that an external vacuum suction nozzle or the like can apply a suction force on the cover together with the connectors in order to mount the connectors simultaneously on a printed circuit board.

26 Claims, 10 Drawing Sheets

CONNECTOR ASSEMBLY

BACKGROUND OF THE INVENTION

1. Field of the Invention

The present invention relates to a connector assembly and particularly to a connector assembly with an auxiliary device for aiding a jig or other fixing mechanism to install the connector assembly onto an electrical device such as a printed circuit board.

2. The Prior Art

With the continuing trend toward compact electronic apparatus, the demand for miniaturized interconnection systems between electronic components of the apparatus is continuously increasing along with the demand to reduce thickness and height parameters of the electronic components.

To reduce the size of electronic components, relatively thin connectors are required for locating and terminating tail portions of terminals related to circuit traces on the printed circuit board. The tails may be soldered to the circuit traces on the board or in holes defined therein, and a complementary connector assembly may be mounted directly to a connector block or interconnected therewith by terminal pins extending through the holes of the printed circuit board.

In an advanced assembling procedure, a connector assembly is usually mounted on a surface of an electrical apparatus such as a printed circuit board by means of a vacuum suction nozzle or the like. However, during installation of the connector assembly onto the printed circuit board, complications always occur such as misalignment of the connector assembly with trace pads on the printed circuit board or improper timing release of the connector assembly from the vacuum-suction nozzle, always occur due to improper cooperation between the vacuum-suction nozzle and the assembly connector.

More specifically, a connector assembly is secured by the vacuum suction nozzle and then brought to a selected position on the printed circuit board. The connector assembly is then released from the vacuum suction nozzle by removing the negative pressure acting thereon. Thereafter, gas is released inside the soldering reflow solder vessel or infrared rays are radiated therein until the solder applied to selected conductors on the printed circuit board has been melted, thereby soldering the selected conductors to solder tails of the electrical connector. The connector assembly should have a smooth or flat top surface for effective use of the vacuum suction nozzle. The connector assembly often has an entire top surface occupied by closely spaced terminal receiving openings which do not provide a level surface, thus hindering the performance of the vacuum suction nozzle.

A detachable cover for the connector assembly has recently been proposed to provide a smooth top surface for engagement and cooperation with the vacuum suction nozzle. Once the connector assembly is positioned on the predetermined mounting surface of the printed circuit board by the vacuum suction nozzle and after the solder reflow process, the cover is removed and the connector assembly is retained on the printed circuit board by the soldering of the solder tails to the selected circuit traces on the printed circuit board.

The prior art related to the above examples have been disclosed in U.S. Pat. Nos. 4,396,245; 4,645,278; 5,026,295; 5,055,971; 5,242,311; 5,249,977; 5,277,601; and 5,383,797. However, the prior art does not include a structure by which more than one connector assembly can be simultaneously mounted on a printed circuit board.

It is therefore requisite to invent a new structure by which the simultaneous mounting of several connector assemblies can be facilitated for promoting manufacturing efficiency.

SUMMARY OF THE INVENTION

The primary purpose of the present invention is to provide a new connector assembly by which a vacuum suction nozzle or the like can mount at least two connectors simultaneously onto a printed circuit board.

In accordance with one aspect of the present invention, a connector assembly comprises at least two connectors and a cover for coupling the connectors. Each connector comprises an insulative housing and a plurality of contacts each of which is partially received in the housing and partially extends from the housing. The housing comprises an upper surface, a lower surface to be mounted on a printed circuit board, and a side periphery interconnected between the upper surface and the lower surface. The cover comprises a plate sufficiently sized to cover a middle portion of the upper surfaces of the connectors. The plate defines at least a hole which forms two elongate side portions in the plate. Clipping means extends from the plate for detachably securing to the side walls of the connectors.

In accordance with a second aspect of the present invention, a connector assembly comprises at least two connectors and a cover for coupling the connectors. Each connector comprises an insulative housing which includes a side periphery defining a slot therein. The cover comprises a plate sufficiently sized to cover a middle portion of upper edges of the side peripheries of the connectors. The plate defines at least a hole which forms two elongate side portions and at least a plane surface portion in the plate for receiving suction force of an external vacuum suction nozzle. Engaging means extends from the elongate side portions of the plate for detachably engaging with opposite inner wall portions of each side periphery of each connector.

In accordance with a third aspect of the present invention, a connector assembly comprises at least two connectors and a cover for coupling the connectors. Each connector comprises an insulative housing which includes a side periphery which defines a slot therein. The cover comprises a plate sufficiently sized to cover a middle portion of upper edges of the side peripheries of the connectors. The plate defines at least a hole which forms two elongate side portions and at least a plane surface portion in the plate for receiving suction force of an external vacuum suction nozzle. Engaging means extends from the elongate side portions of the plate for detachably engaging with outer wall portions of each side periphery of each connector.

DETAILED DESCRIPTION OF THE PREFERRED EMBODIMENTS

References will now be described in detail to the preferred embodiments of the invention. Referring to the drawings and initially to FIG. 1, a new connector assembly 10 in accordance with the present invention comprises a first connector 11, a second connector 13, and a cover 15 for coupling the two connectors 11, 13. The connectors 11, 13 comprise insulative housings 112, 132 and a plurality of contacts 114, 134. The insulative housings 112, 132 further comprise upper surfaces 1121, 1321 and lower surfaces 1122, 1322 opposite the upper surfaces 1121, 1321 for mounting to a printed circuit board 8 (shown in FIG. 3). Side peripheries 1123, 1323 are formed between the upper surfaces 1121, 1321 and the lower surfaces 1122, 1322. A plurality of passages 1124, 1324 are vertically defined between the upper surfaces 1121, 1321 and the lower surfaces 1122, 1322 for receiving the contacts 114, 134. In this embodiment, the connectors 11, 13 are SMT-type connectors, therefore soldering tails 1142, 1342 extended perpendicularly from the contacts 114, 134 received in the passages 1124, 1324.

Figure 1:
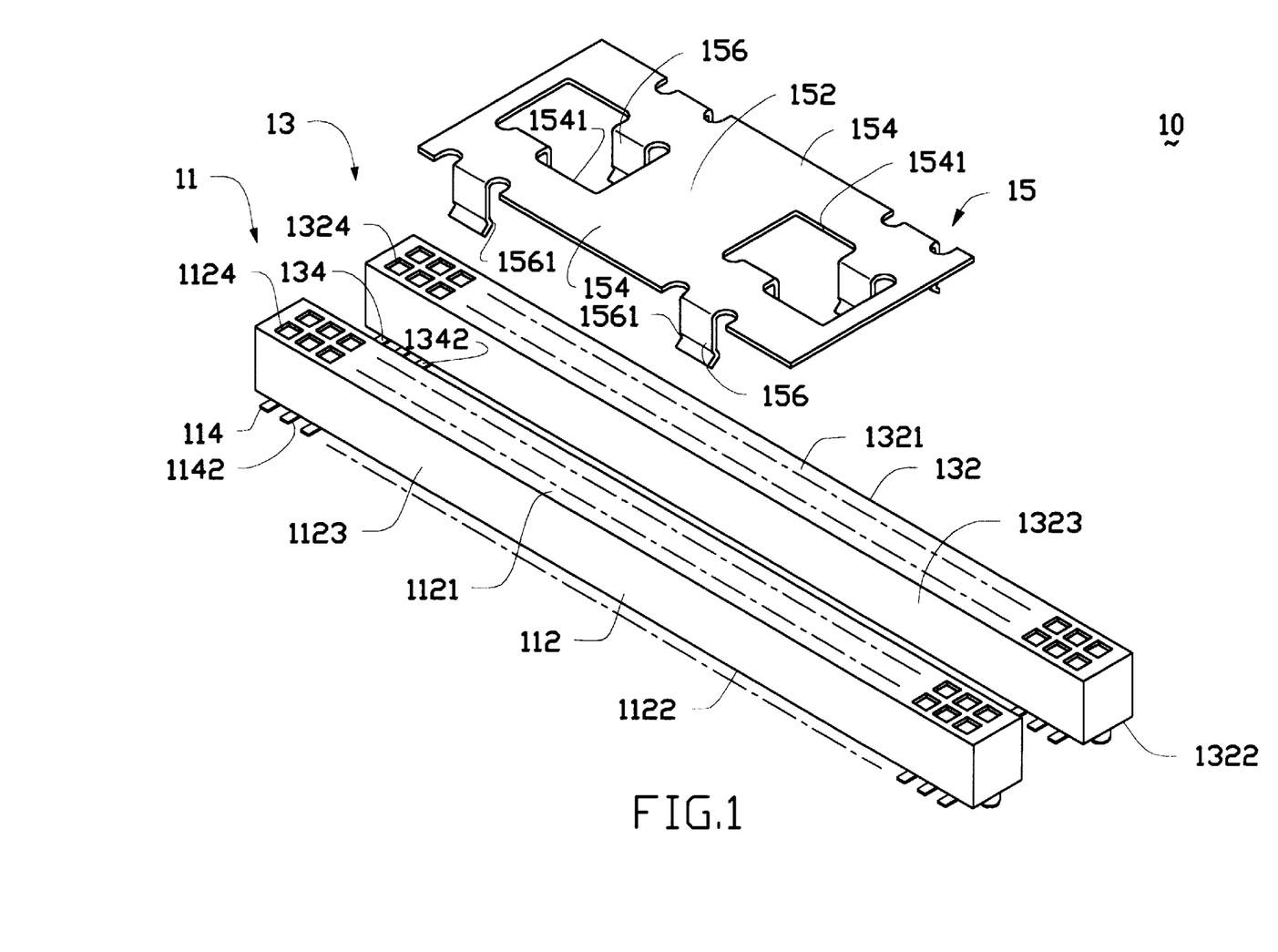
FIG. 1 is a perspective exploded view of a first embodiment of a connector assembly in accordance with the present invention.

The cover 15 comprises a plate 152 sufficiently sized to cover a middle portion of the upper surfaces 1121, 1321 of the connectors 11, 13 provided that the middle portion of the connectors 11, 13 are adjacent to each other. In this embodiment, two holes 1541 are defined in alignment with each other along an elongate direction of the plate 152, thereby forming two elongate portions 154 at lateral sides of the plate 152, respectively. Two pairs of tabs 156 extend downward from two sides of each elongate portion 154 of the plate 152 for engaging with two elongate side walls (not labeled) of the side peripheries 1123 and 1323 of the connectors 11 and 13. Each tab 156 forms a curved lip 1561 at a free end thereof for easing and strengthening the engagement with the side walls of the side peripheries 1122, 1322 of the connectors 11, 13. A central portion of the plate 152 substantially defined between the two holes 1541 is a relatively smooth surface to which the vacuum suction nozzle (not shown) is attached for mounting the connectors 11, 13 onto a printed circuit board (not shown).

The cover 15 can be a conductive structure made from a metal plate through stamping and forming, an insulative structure made of plastic through molding or another well known shaping method, or a combination of metal and plastic via a combination of well known techniques.

Figure 2:
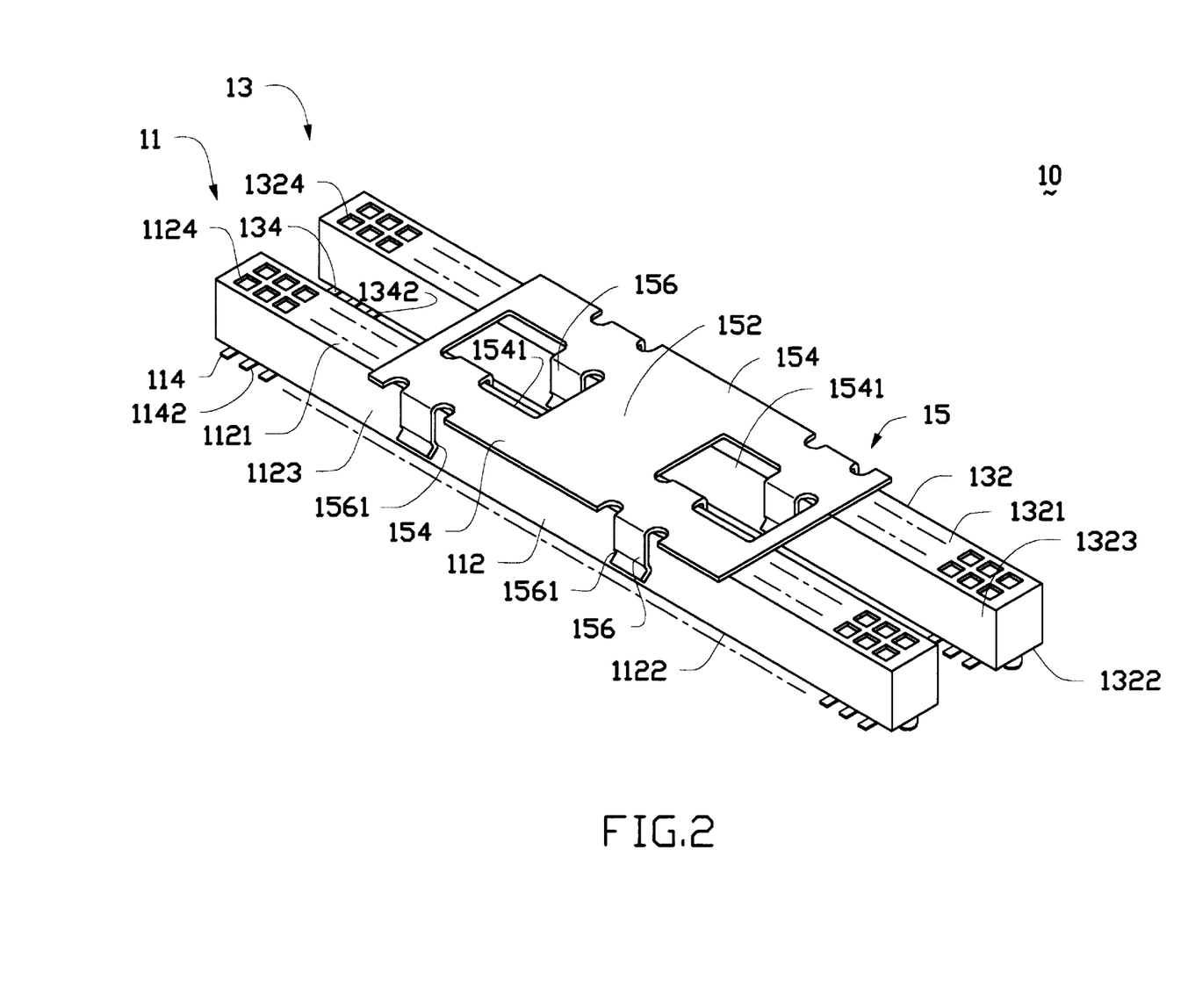
FIG. 2 is an assembled view of FIG. 1.
Figure 3:
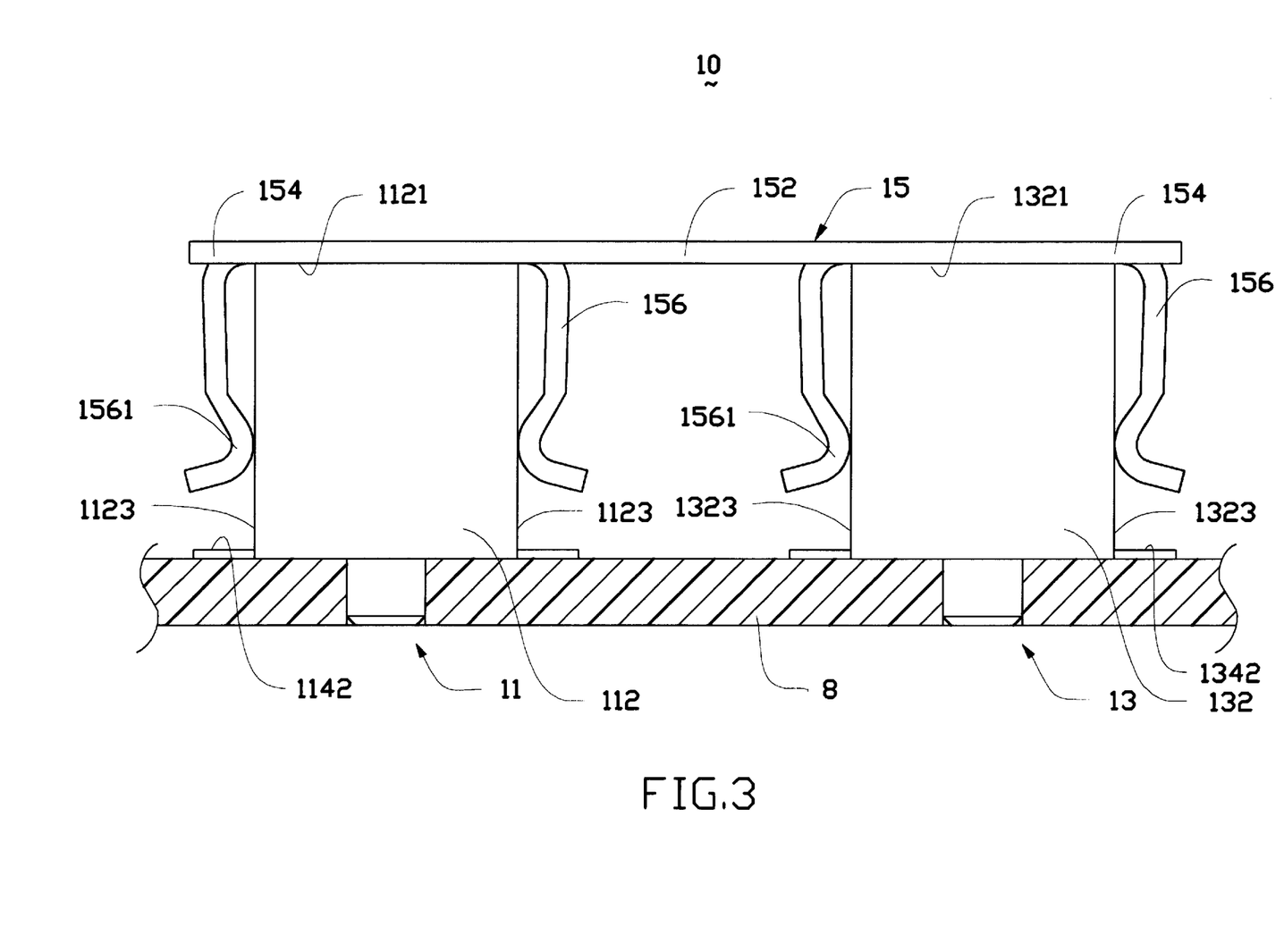
FIG. 3 is an elevational view taken from the right side of FIG. 2.

Referring to FIG. 2, the connectors 11, 13 are assembled with the cover 15, and the plate 152 covers a middle portion of each upper surface 1121 and 1321 of the connectors 11 and 13. The pairs of tabs 156 including the curved lips 1561 engage with the corresponding side walls of peripheries 1123 and 1323 of the connectors 11, 13. FIG. 3 illustrates the engagement between the curved lips 1561 of the cover 15 and the side walls of peripheries 1123, 1323 of the connectors 11, 13, wherein a printed circuit board 8 is also shown for illustrating that the soldering tails 1142, 1342 of the contacts 114, 134 are fixed on the printed circuit board 8 via a well known SMT process.

Figure 4:
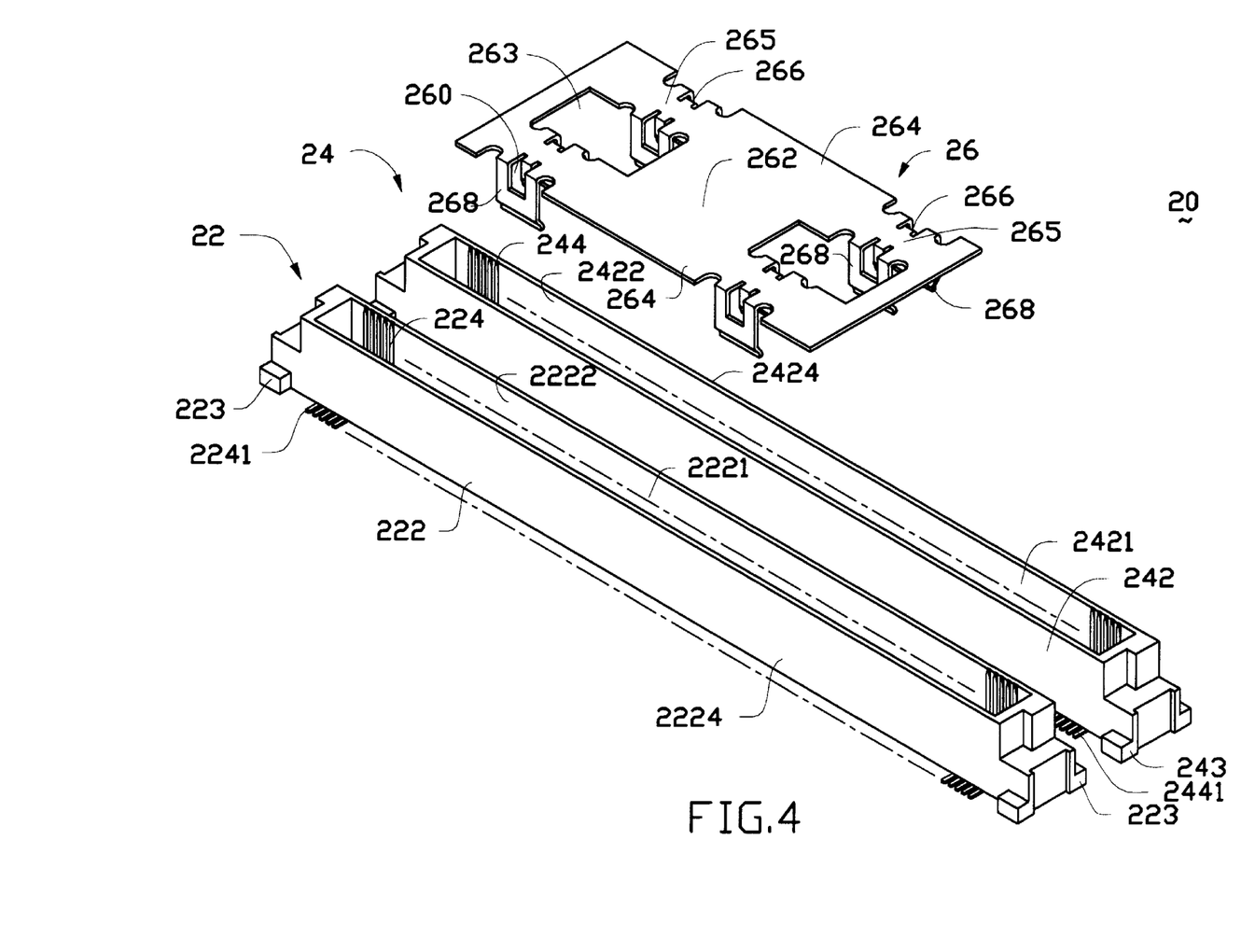
FIG. 4 is a perspective exploded view of a second embodiment of a connector assembly in accordance with the present invention.

Referring to FIG. 4 which shows a second embodiment of the present invention, the connector assembly 20 comprises two connectors 22, 24 and a cover 26 coupling the two connectors 22, 24. The connectors 22, 24 comprise peripheries 222, 242 defining slots 2221, 2421 therein, and include two rows of SMT-type contacts 224, 244 installed on inner walls 2222, 2422 thereof.

Soldering tails 2241, 2441 extend perpendicularly from the contacts 224, 244 for attachment to a printed circuit board 88 (FIG. 6) by a well known SMT process. Blocks 223, 243 extend laterally from each bottom corner of the connectors 22, 24. The blocks 223, 243 extend beyond the ends of the tails 2242, 2441 of the contacts 224, 244 thereby preventing damage from occurring thereon due to impact from an elongate direction. Therefore, when the connectors 22, 24 are positioned adjacent to each other, the tails 2241, 2441 will not contact each other.

Similar to the first embodiment, the cover 26 comprises a plate 262 sufficiently sized to cover a middle portion of the connectors 22, 24 from a farmost outer wall 2224 of the connector 22 to a farmost outer wall 2424 of the connector 24.

The second embodiment is different from the first embodiment in that the connectors 22, 24 define slots 2221, 2421 therein and the engaging structure formed in the cover 26 is different from that of the first embodiment.

Similar to the first embodiment, two holes 263 are defined in alignment with each other along an elongate direction of the plate 262, thereby forming two elongate portions 264 at lateral sides of the plate 262 and two sectional areas 265 at end sections of the elongate portions 264, respectively.

Figure 5:
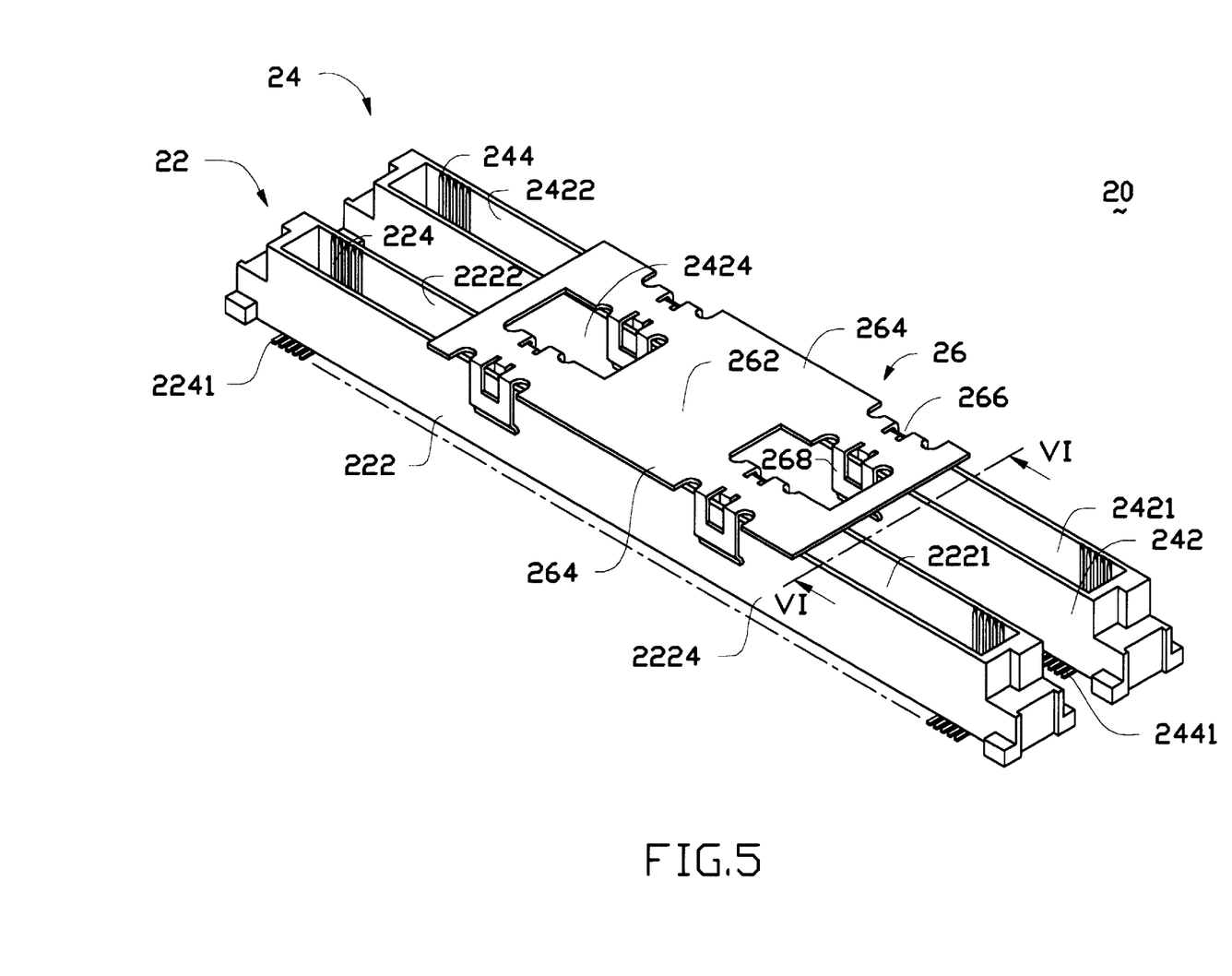
FIG. 5 is an assembled view of FIG. 4.
Figure 6:
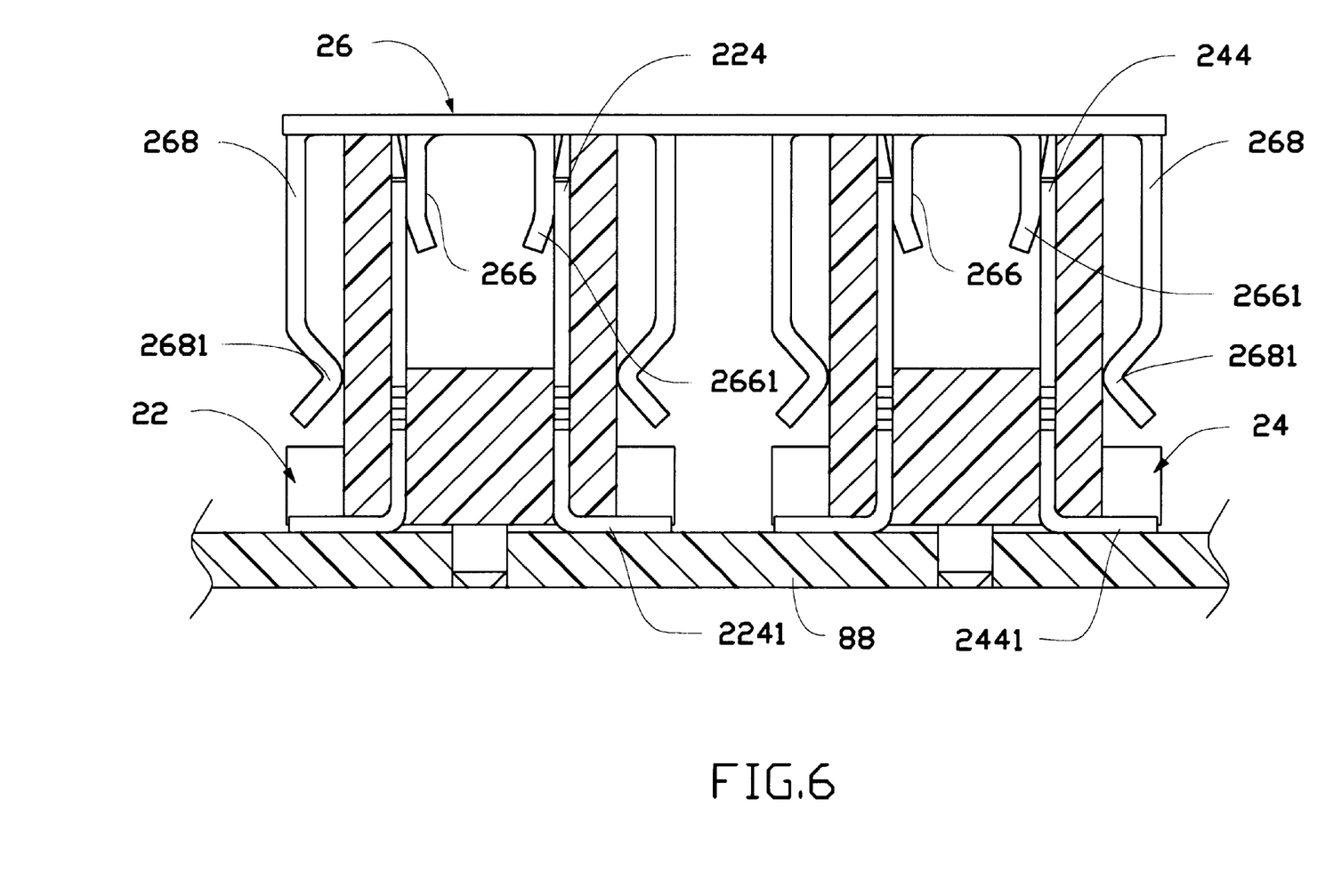
FIG. 6 is a cross-sectional view taken along phantom line VI—VI of FIG. 5.

Also referring to FIGS. 5 and 6, a first pair of tabs 266 and a second pair of tabs 268 extend downward from opposite sides of each sectional area 265 of each elongate portion 264 of the plate 262. The tabs 266, 268 are sufficiently sized so that all of the first pairs of tabs 266 detachably abuts against the opposite inner walls 2222, 2422 of the connectors 22, 24, and each second pair of tabs 268 detachably clamps the outer wall portions 2224, 2424 of the connectors 22, 24. Each side of the sectional area 265 has a first tab 266 and a corresponding second tab 268 extending downward and a space 260 (FIG. 4) is defined therebetween for sufficiently receiving a periphery wall portion of the connectors 22, 24. The first pair of tabs 266 each have a curved end 2661 for easing and strengthening engagement with the inner walls 2222, 2422 of the connectors 22 24. The second pair of tabs 268 each have a curved lip 2681 for easing and strengthening engagement with the elongate periphery portions 222, 242 of the connectors 22, 24. The connectors 22, 24 are therefore detachably engaged by the cover 26.

Figure 7:
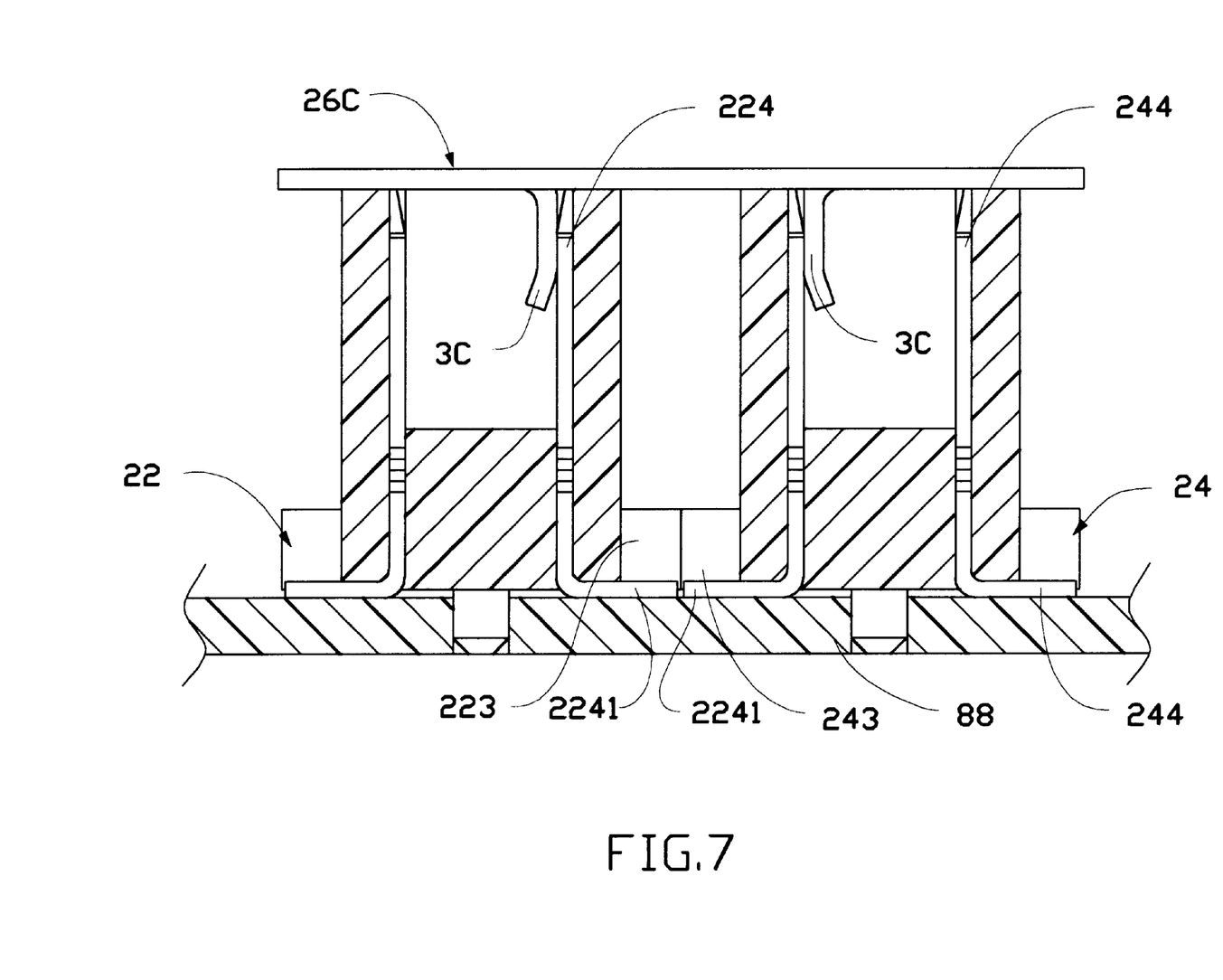
FIG. 7 is a cross-sectional view of a third embodiment of the connector assembly in accordance with the present invention.

There are other embodiments suitable for the connectors 22, 24 of FIG. 4, wherein some of the tabs 266, 268 of the cover 26 may be omitted while the remaining tabs 266, 268 may be simplified for promoting a less complicated manufacturing process. A third embodiment is shown in FIG. 7, wherein a cover 26C is essentially the same as the cover 26 of the second embodiment except that the tabs 266, 268 are replaced with two tabs 3 respectively extending downward from inner sides of each elongate side portion 264 (shown in FIG. 4) of the plate 262 for simultaneously clamping the connectors 22, 24 on the inner wall portions 2222, 2422 thereof. Each tab 3 has a curved end 3C for easing and strengthening the engagement with the inner wall portions 2222, 2422 (actually the contacts 224, 244) of the connectors 22, 24. The blocks 223, 243 of the connectors 22, 24 contact each other when the tabs 3 abut against the inner wall portions 2222, 2422 of the connectors 22, 24. In this embodiment, the connectors 22 and 24 are also detachably engaged by the cover 26.

Figure 8:
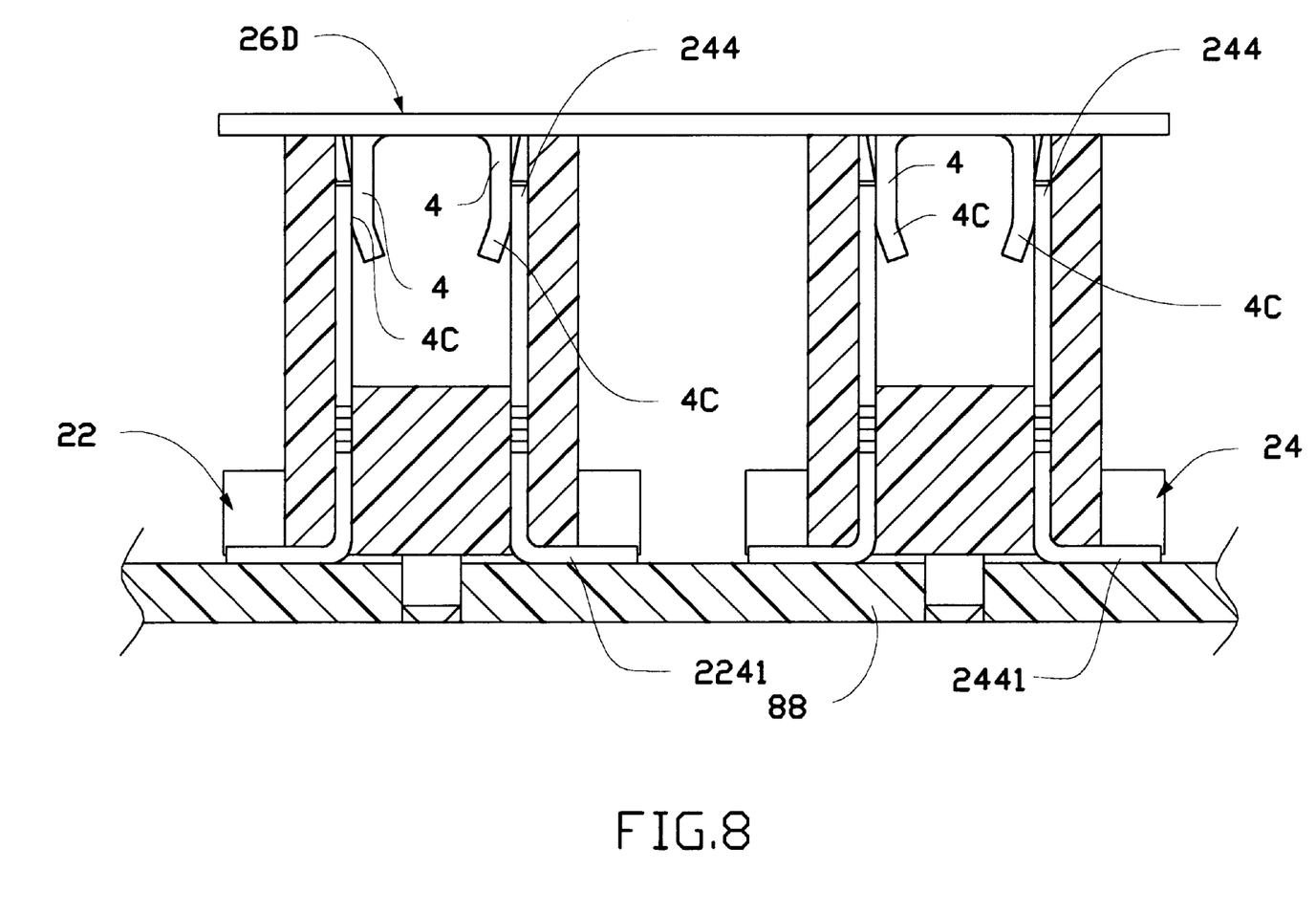
FIG. 8 is a cross-sectional view of a fourth embodiment of the connector assembly in accordance with the present invention.

A fourth embodiment is shown in FIG. 8 which is similar to the third embodiment except that a cover 26D comprises two pairs of tabs 4, each pair extending downward from two sides of each elongate side portion 264 of the plate 262 respectively. Each tab 4 has a curved end 4C for easing and strengthening engagement with the inner wall portions 2222, 2422 of the connectors 22, 24.

Figure 9:
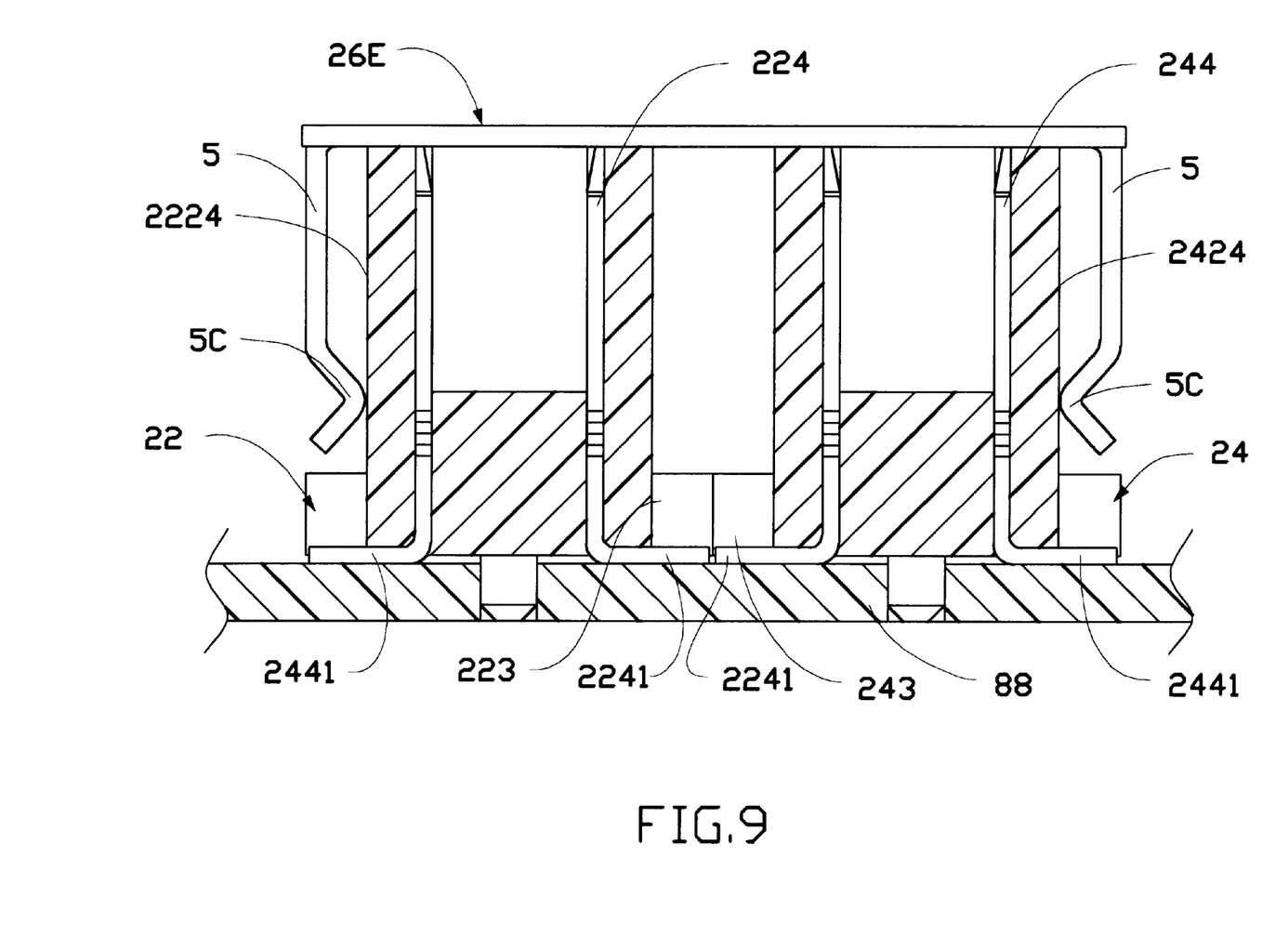
FIG. 9 is a cross-sectional view of a fifth embodiment of the connector assembly in accordance with the present invention.

FIG. 9 illustrates a fifth embodiment, wherein two tabs 5 respectively extend from two elongate portions 264 of a cover 26E for engaging with outer wall portions of the connectors 22, 24 provided that the blocks 223, 224 abut against each other. In this embodiment, each tab 5 has a curved end 5C for easing and strengthening engagement between the tab 5 and the corresponding outer wall portion 2422, 2424 of the connectors 22, 24.

Figure 10:
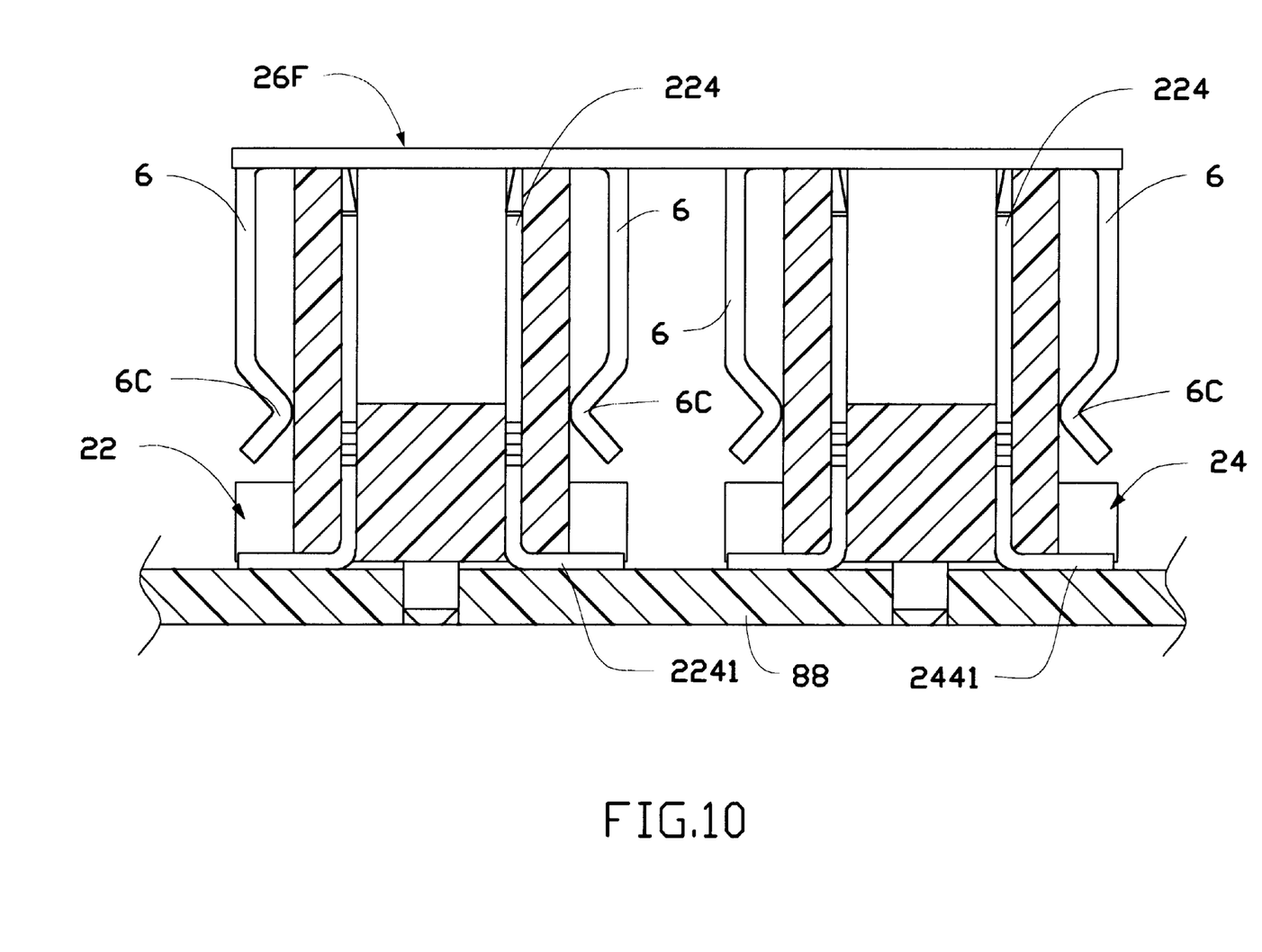
FIG. 10 is a cross-sectional view of a sixth embodiment of the connector assembly in accordance with the present invention.

FIG. 10 illustrates a sixth embodiment, wherein two pairs of tabs 6 respectively extend downward from two sides of elongate side portions 264 of a cover 26F to clamp outer wall portions 2224, 2424 of the connectors 22 and 24. Each tab 6 has a curved end 6C for easing and strengthening engagement with the outer wall portions 2224, 2424 of the corresponding connectors 22, 24.

While the present invention has been described with reference to specific embodiment, the description is illustrative of the invention and is not to be construed as limiting the invention.

Therefore, various modifications to the present invention can be made to the preferred embodiment by those skilled in the art without departing from the true spirit and scope of the invention as defined by the appended claims.

What is claimed is:

1. A connector assembly comprising:
   at least two connectors and a cover for coupling said at least two connectors;
   each said connector comprising an insulative housing and a plurality of contacts each of which is partially received in said housing and partially extends from said housing;
   said housing comprising an upper surface, a lower surface to be mounted on a printed circuit board, and a side periphery interconnected between the upper surface and the lower surface;
   said cover comprising a plate sufficiently sized to cover a middle portion of said upper surfaces of said at least two connectors, said plate defining at least a hole therein which forms two side portions in the plate; and
   clipping means extending from said plate for detachably securing to said side peripheries of said at least two connectors.

2. The connector assembly as claimed in claim 1, wherein said contacts are SMT-type contacts.

3. The connector assembly as claimed in claim 1, wherein said clipping means comprises at least two pairs of tabs extending downward from said side portions of said plate for engagement with outer wall portions of said at least two connectors.

4. The connector assembly as claimed in claim 1, wherein each said tab has a curved end for easing and strengthening engagement with the corresponding outer wall portion of the corresponding connector.

5. The connector assembly as claimed in claim 1, wherein said cover is made of conductive material.

6. The connector assembly as claimed in claim 1, wherein said cover is made of insulative material.

7. A connector assembly comprising:
   at least two connectors and a cover for coupling said at least two connectors;
   each said connector comprising an insulative housing which includes a side periphery defining a slot therein;
   said cover comprising a plate sufficiently sized to cover a middle portion of upper edges of said side peripheries of said at least two connectors;
   said plate defining at least a hole therein which forms two side portions and at least a plane surface portion in the plate for receiving suction force of an external vacuum suction nozzle; and
   first engaging means extending from said elongate side portions of said plate for detachably engaging with opposite inner wall portions of each said side periphery of each said connector.

8. The connector assembly as claimed in claim 7, further comprising second engaging means extending from said elongate side portions of said plate for detachably engaging with outer wall portions of each said side periphery of each said connector.

9. The connector assembly as claimed in claim 7, wherein said first engaging means comprises at least two tabs each of which respectively abuts against a corresponding inner wall portion of each said side periphery of each said connector.

10. The connector assembly as claimed in claim 7, wherein said first engaging means comprises at least two pairs of tabs each of which extends downward from a corresponding said side portion of said plate and abuts against opposite inner wall portions of each said side periphery of each said connector.

11. The connector assembly as claimed in claim 9, wherein each tab of the first engaging means has a curved end for easy engagement with the corresponding inner wall of each said connector.

12. The connector assembly as claimed in claim 10, wherein each said tab of the first engaging means has a curved end for easy engagement with the corresponding inner wall of each said connector.

13. The connector assembly as claimed in claim 8, wherein said second engaging means comprises at least two tabs each of which cooperates with a corresponding said tab of said first engaging means to abut against a corresponding outer wall portion of each said side periphery of each said connector.

14. The connector assembly as claimed in claim 8, wherein said second engaging means comprises at least two pairs of tabs, each said pair of tabs clamping on an outer wall portion of each said side periphery of each said connector.

15. The connector assembly as claimed in claim 13, wherein each said tab of said second engaging means has a curved end for engagement with the corresponding outer wall portion of each said connector.

16. The connector assembly as claimed in claim 14, wherein each said tab of the second engaging means has a curved end for engagement with the corresponding outer wall portion of each said connector.

17. A connector assembly comprising:
   at least two connectors and a cover for coupling said at east two connectors;

each said connector comprising an insulative housing which includes a side periphery defining a slot therein;

said cover comprising a plate sufficiently sized to cover a middle portion of upper edges of said side peripheries of said at least two connectors;

said plate defining at least a hole therein which forms two side portions and at least a plane surface portion in the plate for receiving suction force of an external vacuum suction nozzle; and first engaging means extending from said elongate side portions of said plate for detachably engaging with outer wall portions of each said side periphery of each said connector.

18. The connector assembly as claimed in claim 17, further comprising second engaging means extending from said side portions of said plate for detachably engaging with inner wall portions of each said side periphery of each said connector.

19. The connector assembly as claimed in claim 17, wherein said first engaging means comprises at least two tabs each of which respectively abuts against a corresponding outer wall portion of each said side periphery of each said connector.

20. The connector assembly as claimed in claim 17, wherein said first engaging means comprises at least two pairs of tabs each of which extends downward from a corresponding said side portions of said plate and abuts against opposite outer wall portions of each said side periphery of each said connector.

21. The connector assembly as claimed in claim 19, wherein each tab of the first engaging means has a curved end for strengthening engagement with the corresponding outer wall portion of each said connector.

22. The connector assembly as claimed in claim 20, wherein each said tab of the first engaging means has a curved end for strengthening engagement with the corresponding outer wall portion of each said connector.

23. The connector assembly as claimed in claim 18, wherein said second engaging means comprises at least two tabs each of which cooperates with a corresponding said tab of said first engaging means to abut against a corresponding inner wall portion of each said side periphery of each said connector.

24. The connector assembly as claimed in claim 18, wherein said second engaging means comprises at least two pairs of tabs, each said pair of tabs abutting against an inner wall portion of each said side periphery of each said connector.

25. The connector assembly as claimed in claim 23, wherein each said tab of said second engaging means has a curved end for engagement with the corresponding inner wall portion of each said connector.

26. The connector assembly as claimed in claim 24, wherein each said tab of the second engaging means has a curved end for engagement with the corresponding inner wall portion of each said connector.

* * * * *